United States Patent
Ueda et al.

(10) Patent No.: US 8,552,688 B2
(45) Date of Patent: Oct. 8, 2013

(54) ON-VEHICLE BATTERY CONDITION ESTIMATION DEVICE

(75) Inventors: Kenji Ueda, Nagoya (JP); Satoru Mizuno, Okazaki (JP); Shigenori Saito, Nukata-gun (JP)

(73) Assignees: Nippon Soken, Inc., Nishio (JP); Denso Corporation, Kariya (JP)

( * ) Notice: Subject to any disclaimer, the term of this patent is extended or adjusted under 35 U.S.C. 154(b) by 676 days.

(21) Appl. No.: 12/453,879

(22) Filed: May 26, 2009

(65) Prior Publication Data

US 2009/0295399 A1 Dec. 3, 2009

(30) Foreign Application Priority Data

May 28, 2008 (JP) .................................. 2008-139493

(51) Int. Cl.
*H02J 7/00* (2006.01)
(52) U.S. Cl.
USPC .......................................... 320/132; 324/430
(58) Field of Classification Search
USPC ....................................................... 320/132
See application file for complete search history.

(56) References Cited

U.S. PATENT DOCUMENTS

| 7,148,653 | B2* | 12/2006 | Mauro et al. | 320/104 |
| 2007/0182385 | A1* | 8/2007 | Ueda et al. | 323/211 |
| 2007/0200567 | A1* | 8/2007 | Mizuno et al. | 324/430 |
| 2009/0115419 | A1 | 5/2009 | Ueda et al. | |

FOREIGN PATENT DOCUMENTS

| JP | A-2005-331518 | 12/2005 |
| JP | A-2006-258070 | 9/2006 |
| JP | A-2007-223530 | 9/2007 |

* cited by examiner

*Primary Examiner* — Drew A Dunn
*Assistant Examiner* — Robert Grant
(74) *Attorney, Agent, or Firm* — Oliff & Berridge, PLC

(57) ABSTRACT

A battery condition estimation device estimates a pre-restart voltage drop amount $\Delta Vjh+\Delta Vbn$ of a battery mounted to a vehicle during period T1 to T2 from initiation of an engine stop until initiation of an engine restart based on detection values regarding the battery condition. The device estimates a voltage drop amount $\Delta Vst$ during period T3 from initiation of the engine restart until completion of the engine restart based on the detection values regarding the battery condition. The device finally estimates a minimum voltage of the battery during period T1 to T3 from the initiation of the engine stop until the completion of the engine restart based on a voltage detection value Vj0 before the engine stop, the pre-restart voltage drop amount $\Delta Vjh+\Delta Vbn$, and the voltage drop amount $\Delta Vst$.

9 Claims, 6 Drawing Sheets

ON-VEHICLE BATTERY CONDITION ESTIMATION DEVICE

CROSS-REFERENCE TO RELATED APPLICATION

This application is related to and claims priority from Japanese Patent Application No. 2008-139493 filed on May 28, 2008, the contents of which are hereby incorporated by reference.

BACKGROUND OF THE INVENTION

1. Field of the Invention

The present invention relates to an on-vehicle battery condition estimation device capable of estimating the condition of a battery mounted to a vehicle for starting an internal combustion engine and to supply electric power to various types of electrical control devices.

2. Description of the Related Art

An on-vehicle battery serves as a device to supply an engine starter in order to start the operation of an internal combustion engine and serves as an electric power supplying device to supply electric power to various types of electrical control devices. In order to ensure the steady supply of an electric power to those electrical control devices, that is, to keep the reliability in operation of those electrical control devices, and to prevent remarkable deterioration in quality of the on-vehicle battery caused by over-discharge, the on-vehicle battery must be kept at a voltage of not less than its lower limit voltage.

When the vehicle is equipped with an idling stop control system, it is required to estimate the lower limit voltage of the on-vehicle battery in order to keep the voltage of the on-vehicle battery, which is decreased by the engine start operation, not less than its lower limit voltage, and in order also to keep the battery voltage capable of supplying a necessary amount of electric power to an engine starter.

There are various conventional devices for estimating the lower limit voltage of an on-vehicle battery mounted to a vehicle. For example, Japanese patent laid open publication No. JP 2006-258070 disclosed a conventional technique to estimate a charging condition of the on-vehicle battery when the vehicle stops and to allow the execution of the idling stop control to automatically stop the internal combustion engine of the vehicle when the on-vehicle battery has a charged electric power to start the internal combustion engine.

In addition, JP 2007-223530 has disclosed another conventional technique to estimate an internal resistance value of the on-vehicle battery for use to estimate a voltage drop of an on-vehicle battery when an internal combustion engine restarts.

However, the above conventional techniques calculate a necessary electric power based on an internal resistance value of the on-vehicle battery that is estimated when the internal combustion engine starts, and then permit the execution of the idling stop control when the on-vehicle battery stores the electric power of not less than a necessary electric power to start the internal combustion engine. The conventional control operations described above do not detect how long the idling stop control can be performed. That is, even if the vehicle is under the idling stop control, it is necessary to perform the electric power generation by the internal combustion engine when the voltage of the on-vehicle battery drops. In this case, the idling stop control must be halted. When the above idling stop control is performed under using the inadequately estimation results described above, the on-vehicle battery is deteriorated and may inconvenience the driver and passengers.

SUMMARY OF THE INVENTION

It is an object of the present invention to provide an on-vehicle battery condition estimation device capable of precisely estimating a lower limit voltage of the on-vehicle battery, as an electric power supply source to start an internal combustion engine mounted to a vehicle, accompanying the start and restart of the internal combustion engine.

To achieve the above purposes, the present invention provides a battery condition estimation device capable of estimating the condition or state of an on-vehicle battery mounted to a vehicle. The on-vehicle battery acts as an electric power supply source to supply an electric power to on-vehicle devices such as an engine starter to start and restart the internal combustion engine. The battery condition estimation device is comprised of a pre-start operation voltage drop estimation means, a start operation voltage drop estimation means, and a minimum voltage estimation means. The pre-start voltage drop estimation means is capable of estimating a battery voltage drop amount, as a pre-start operation voltage drop amount of the on-vehicle battery, based on at least one of detection values regarding the battery condition during a period from initiation of a stop operation of the internal combustion engine until initiation of a restart operation of the internal combustion engine. The start operation voltage drop estimation means is capable of estimating a battery voltage drop amount, as a start operation voltage drop amount, based on at least one of the detection values regarding the battery condition during a period from the initiation of the restart operation of the internal combustion engine until completion of the restart operation of the internal combustion engine. The minimum voltage estimation means is capable of estimating a minimum voltage of the on-vehicle battery during a period from the initiation of the stop operation of the internal combustion engine until the completion of the restart operation of the internal combustion engine based on a voltage value of the on-vehicle battery detected before the initiation of the stop operation of the internal combustion engine, the pre-start voltage drop amount of the on-vehicle battery estimated by the pre-start operation voltage drop estimation means, and the start operation voltage drop amount estimated by the start operation voltage drop estimation means.

According to the on-vehicle battery condition estimation device of the present invention, the pre-start operation voltage drop estimation means estimates the battery voltage drop amount as the pre-start operation voltage drop amount during the period from the initiation of the stop operation until the initiation of the restart operation of the internal combustion engine based on at least one of the detection values regarding the battery condition. The detection values regarding the battery condition are a voltage detection value of the on-vehicle battery, a current detection value of the on-vehicle battery, a current change amount detection value of the on-vehicle battery, an internal resistance value of the on-vehicle battery, and others (the detection values of the battery condition will be used later as the same meaning). The start operation voltage drop estimation means estimates the battery voltage drop amount as the start operation voltage drop amount during the period from the initiation of the restart operation until the completion of the restart operation of the internal combustion engine based on at least one of the detection values of the battery condition. Further, the minimum voltage estimation means estimates the minimum voltage of the on-vehicle battery during the period from the initiation of the stop operation until the completion of the restart operation of the internal combustion engine based on the voltage detection value of the on-vehicle battery detected before the initiation of the stop operation of the internal combustion engine, the pre-start voltage drop amount of the on-vehicle battery estimated by the pre-start operation voltage drop estimation means, and the start operation voltage drop amount estimated by the start operation voltage drop estimation means.

Accordingly, the on-vehicle battery condition estimation device can precisely estimate the minimum voltage value of the battery voltage of the on-vehicle battery accompanying the stop operation and the restart operation of the internal combustion engine based on the estimated values, that is, the pre-restart operation voltage drop amount during the period from the initiation of the stop operation until the initiation of the restart operation of the internal combustion engine, and the start voltage drop amount during the period from the initiation of the restart operation until the completion of the restart operation of the internal combustion engine.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
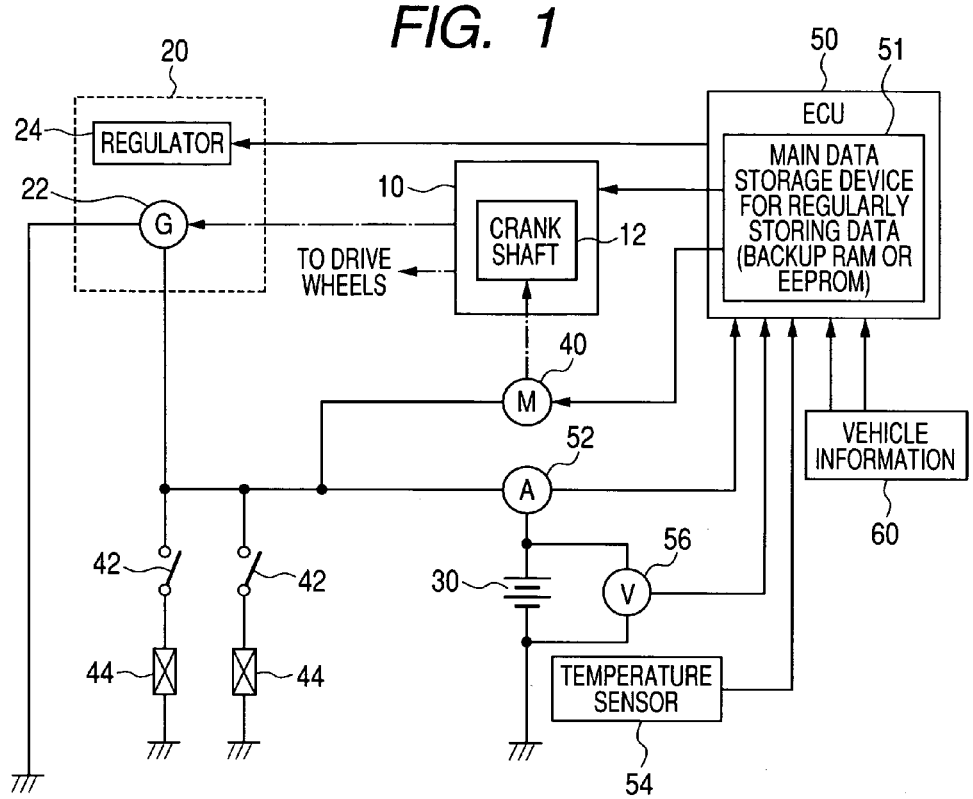
FIG. 1 is a block diagram showing an electric power source system for a vehicle to which an on-vehicle battery condition estimation device according to an embodiment of the present invention is applied.

Hereinafter, various embodiments of the present invention will be described with reference to the accompanying drawings. In the following description of the various embodiments, like reference characters or numerals designate like or equivalent component parts throughout the several diagrams.

Embodiment

A description will be given of the on-vehicle battery condition estimation device according to an embodiment of the present invention with reference to diagrams.

FIG. 1 is a block diagram showing an electric power source system for a vehicle to which the on-vehicle battery condition estimation device according to the embodiment of the present invention is applied.

The internal combustion engine 10 is a device to generate a driving power of the vehicle. A crank shaft 12 as the output shaft of the internal combustion engine 10 is mechanically connected to driving wheels. On the other hand, an electric power generation device 20 is equipped with an AC generator 22 or an alternator and a regulator 24. The regulator 24 acts as a control circuit to control the output of the AC generator 22. A rotor of the AC generator 22 is mechanically connected to the crank shaft 12 of the internal combustion engine 10 and rotates by the rotational power of the crank shaft 12.

An on-vehicle battery 30 (will be also referred to as the "battery 30" for short) is a lead storage battery connected to an output terminal of the AC generator 22 of the electric power generation device 20.

A plurality of electrical loads 44 is connected to the battery 30 through switches 42. The electrical loads 44 and the battery 30 are connected in parallel. An engine starter 40 is electrically connected to the battery 30. The engine starter 40 is one of the electrical loads. The engine starter 40 supplies an initial rotation power to the crank shaft 12 of the internal combustion engine 10.

An electric control unit (ECU) 50 is an electric control device composed mainly of a microcomputer, a main data storage device 51 for regularly storing data, and others. This main data storage device 51 is a non-volatile memory such as a backup RAM and a EEPROM capable of regularly storing data regardless of electric power supply by a starting switch of a control system for the internal combustion engine 10.

The ECU 50 mainly controls the operation of the internal combustion engine 10 and the electric power generation device 20. In particular, the ECU 50 controls the output voltage of the electric power generation device 20 based on a charging current and a discharging current of the on-vehicle battery 30 (a current flowing into/out the on-vehicle battery 30) detected by a current sensor 52, a temperature of the battery 30 detected by a temperature sensor 54, and a voltage of the battery 30 detected by a voltage sensor 56.

In more detail, the ECU 50 generates and outputs an instruction value to the electric power generation device 20 in order to adjust the voltage of the electric power generation device 20. The regulator 24 controls the AC generator 22 to output the voltage which is indicated by the control signal. The regulator 24 prevents the output voltage of the electric power generation device 20 from exceeding the instruction value by increasing the rotation speed of the internal combustion engine 10 and decreasing the electric load of the vehicle.

Further, the ECU 50 performs the idling stop control based on the general consideration of the vehicle information 60 such as the state of the battery 30 when the vehicle stops, the state of the internal combustion engine 10, a vehicle speed signal, and a brake control signal. The ECU 50 performs the idling stop control. This idling stop control includes an automatic stop control and an automatic start control. The automatic stop control automatically stops the idling rotation speed control and further stops the operation of the internal combustion engine 10. The automatic start control performs the idling stop control.

A description will now be given of the voltage drop accompanying the idling stop control with reference to FIG. 2.

Figure 2:
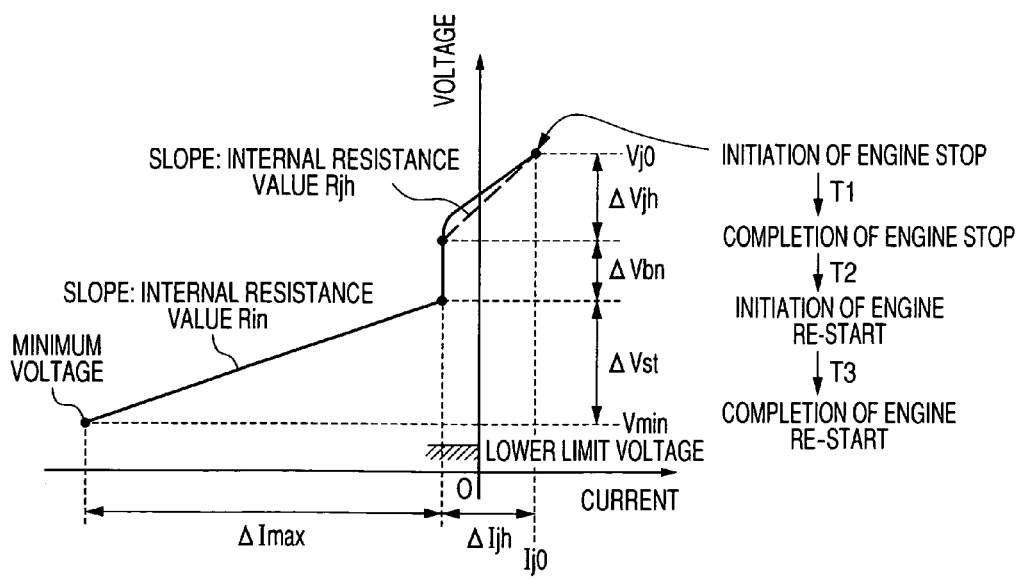
FIG. 2 is an explanatory view showing the current-voltage characteristics of the on-vehicle battery during the period from initiation of a start operation until completion of a restart operation of the internal combustion engine.

FIG. 2 is an explanatory view showing current-voltage characteristics of the on-vehicle battery 30 during the period from the initiation of the stop operation until the completion of the restart operation of the internal combustion engine 10. That is, FIG. 2 shows the voltage drop of the on-vehicle battery 30 during each of the periods T1, T2, and T3 from the initiation of the stop operation until the completion of the restart operation of the internal combustion engine 10.

Firstly, when the ECU 50 instructs the internal combustion engine 10 to automatically stop its operation, the internal combustion engine 10 initiates the stop operation. The rotation speed of the crank shaft 12 is gradually decreased, and becomes finally zero. The stop operation of the internal combustion engine 10 is thereby completed. According to the decrease of the rotation speed of the crank shaft 12, the amount of the electric power generated by the AC generator 22 which is mechanically connected to the crank shaft 22 is gradually decreased.

As shown in FIG. 2, the voltage of the on-vehicle battery 30 is decreased from the voltage Vj0 by ΔVjh during the period T1 from the initiation of the stop operation of the internal combustion engine 10 until the completion of the stop operation of the internal combustion engine 10.

Following this, the voltage drop is generated in the on-vehicle battery 30 during the period from the completion of the stop operation of the internal combustion engine 10 until the initiation of the electric power generation by the AC generator 22 by the drop of the battery capacitance caused by supplying the electric power from the on-vehicle battery 30 to the electrical loads of the vehicle and by polarization of the battery 30. As shown in FIG. 2, the voltage of the battery 30 is decreased by the voltage drop ΔVbn during the period T2 from the completion of the stop operation of the internal combustion engine 10 until the initiation of the restart operation of the internal combustion engine 10.

The automatic restart operation of the internal combustion engine 10 is performed by starting the operation of the engine starter 40 to transmit the initial rotation power to the crank shaft 12 and by performing the combustion control.

During a very short period of time from providing the instruction to the starter 40 in order to start the operation of the internal combustion engine 10 until the initiation of the rotation of the starter 40, a large discharging current flows from the battery 30 to the starter 40. The voltage of the on-vehicle battery 30 is drastically decreased by this large discharging current. As shown in FIG. 2, the voltage of the on-vehicle battery 30 is decreased by the voltage drop amount ΔVst during the period T3, including this very short period of time, counted from providing the instruction to start the internal combustion engine 10 (after the initiation of the restart operation of the internal combustion engine 10 by starting the operation of the starter 40) until the completion of the restart operation of the internal combustion engine 10.

On the other hand, the minimum supplying voltage (the lower limit voltage) of the on-vehicle battery 30 capable of maintaining the reliability in operation of the ECU 50 is determined by the minimum voltage capable of guaranteeing the operation of auxiliary devices in order to supply the necessary voltage from the on-vehicle battery 30 to the auxiliary devices such as a BBC (Backup Boost Converter).

When the voltage of the battery 30 is greatly decreased accompanying the automatic start operation of the internal combustion engine 10, the reliability in operation of the ECU 50 is decreased, and this makes it difficult to restart the internal combustion engine 10. Further, there is a possibility of greatly deteriorating the battery 30 by the over-discharge of the battery 30. In order to avoid those, it is preferable to perform the idling stop control for the internal combustion engine 10 under the condition to satisfy that the voltage of the battery 30 is more than the lower limit voltage. This condition guarantees the operation of the ECU 50 during the period from the initiation of the stop operation of the internal combustion engine 10 until the completion of the restart of the internal combustion engine 10.

In the embodiment of the present invention, the on-vehicle battery condition estimation device estimates the voltage drop amount of the on-vehicle battery 30 during each period accompanying the idling stop control and then estimates the lower limit voltage of the battery 30 which is necessary to allow the optimum idling stop control.

Figure 3:
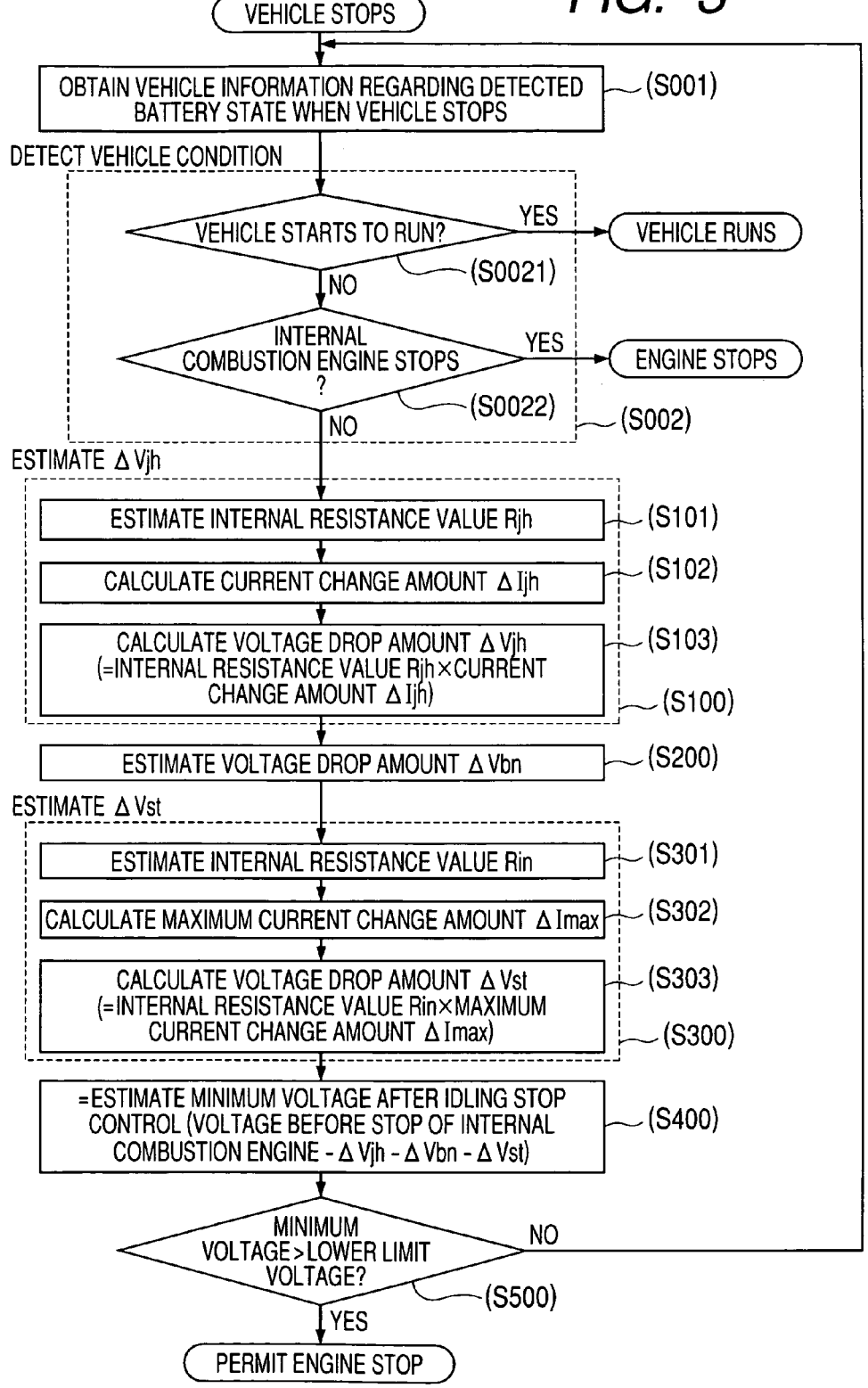
FIG. 3 is a flow chart showing a battery condition estimation operation performed by the on-vehicle battery condition estimation device according to the embodiment of the present invention.

A description will now be given of the estimation of the battery condition performed by the ECU 50 with reference to FIG. 3. FIG. 3 is a flow chart showing a battery condition estimation operation performed by the on-vehicle battery condition estimation device according to the embodiment of the present invention;

The flow chart in FIG. 3 shows the estimation of the voltage drop amount in each period after the vehicle stops and the adjustment to allow the idling stop control for the internal combustion engine 10.

At first, the ECU 50 performs the battery condition operation. That is, the ECU 50 inputs detection results such as a voltage, a current, and a temperature of the battery 30 transferred from the voltage sensor 56, the current sensor 52, and the temperature sensor 54, and accumulates the current value of the battery 30, and detects a polarization state of the battery 30, a capacitance of the battery 30, a state of charge (SOC, charging state) of the battery 30, and a state of function (SOF, response voltage) of the battery 30 (step S001).

The voltage detection value Vj0 and the current detection value Ij0 immediately before the initiation of the stop operation of the internal combustion engine 10 are stored in the main data storage device 51 for regularly storing data (such as a backup RAM, or a EEPROM) of the ECU 50.

Next, the ECU 50 detects the vehicle condition (step S002). Specifically, the ECU 50 firstly detects whether or not the vehicle starts to run (step S0021).

When the detection result indicates that the vehicle is already running ("Yes" in step S0021), the ECU 50 performs the drive control of the vehicle without performing the estimation process of the voltage drop amount of the battery 30. On the other hand, when the detection result indicates that the vehicle is not running ("No" in step S0021), the operation flow progresses to step S0022.

In step S0022, the ECU 50 detects whether or not the vehicle driver instructs the internal combustion engine 10 to be stopped.

The detection result indicates that the vehicle driver instructs the internal combustion engine 10 to stop ("Yes" in step S0022), the ECU 50 performs the stop control for the internal combustion engine 10 without performing any process to estimate the voltage drop amount of the battery 30.

On the other hand, when the detection result indicates that the vehicle driver does not instruct the internal combustion engine 10 to be stopped ("No" in step S0022), the ECU 50 estimates the voltage drop amount ΔVjh of the on-vehicle battery 30 during the period T1 from the initiation of the stop operation of the internal combustion engine 10 until the completion of the stop operation of the internal combustion engine 10 (step S100).

By the way, the internal resistance value Rjh of the on-vehicle battery 30 is designated by the bold dotted line during the period T1 shown at the upper side in FIG. 2. The bold dotted line has a slope that connects the both sides of the curve during the period T1. In the period T1, the current change amount ΔIjh in the battery 30 is expressed by the width in the lateral direction. The ECU 50 can estimate the voltage drop amount ΔVjh of the on-vehicle battery 30 based on those values Rjh and ΔIjh.

Specifically, the ECU 50 estimates the internal resistance value Rjh using the internal resistance value Rjh estimation map that stores a relationship between the current value of the battery 30 and the internal resistance value Rjh in a one to one correspondence (step S101). For example, the main data storage device 51 for regularly storing data such as the backup RAM or EEPROM in the ECU 50 stores the internal resistance value Rjh estimation map.

In more detail, when the output voltage obtained at the step S001 is equal to an adjustment voltage, the ECU 50 estimates the internal resistance value Rjh of the battery 50 based on the detected current value Ij0 using the internal resistance value Rjh estimation map M1 (hereinafter, also referred to as the "current-internal resistance value map") shown in FIG. 4A.

Figure 4A:
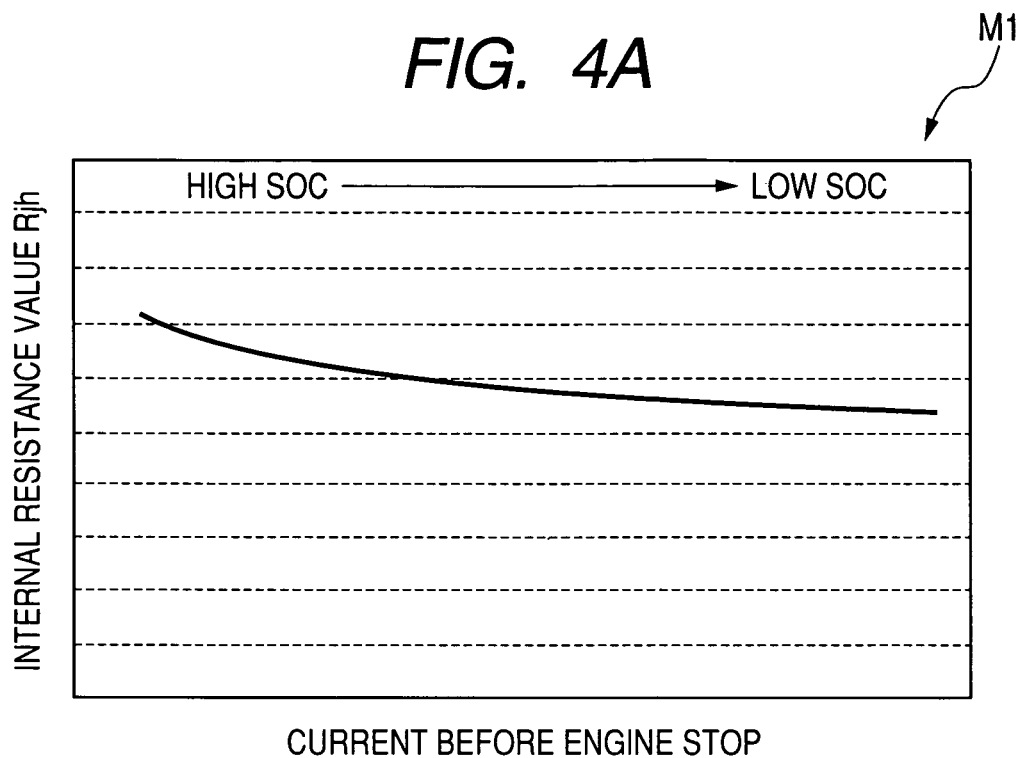
FIG. 4A is an estimation map M1 storing a relationship between an internal resistance value Rjh and a current of the on-vehicle battery before the stop operation of the internal combustion engine in a one to one correspondence.

FIG. 4A is the internal resistance value Rjh estimation map M1 storing the relationship between an internal resistance value Rjh and a current of the on-vehicle battery 30 in a one to one correspondence before the stop operation of the internal combustion engine.

On the other hand, when the output voltage obtained at the step S001 is less than the adjustment voltage, the ECU 50 estimates the internal resistance value Rjh of the battery 50 based on the detected voltage value Vj0 using the internal resistance value Rjh estimation map M2 (hereinafter, also referred to as the "voltage-internal resistance value map") shown in FIG. 4B.

Figure 4B:
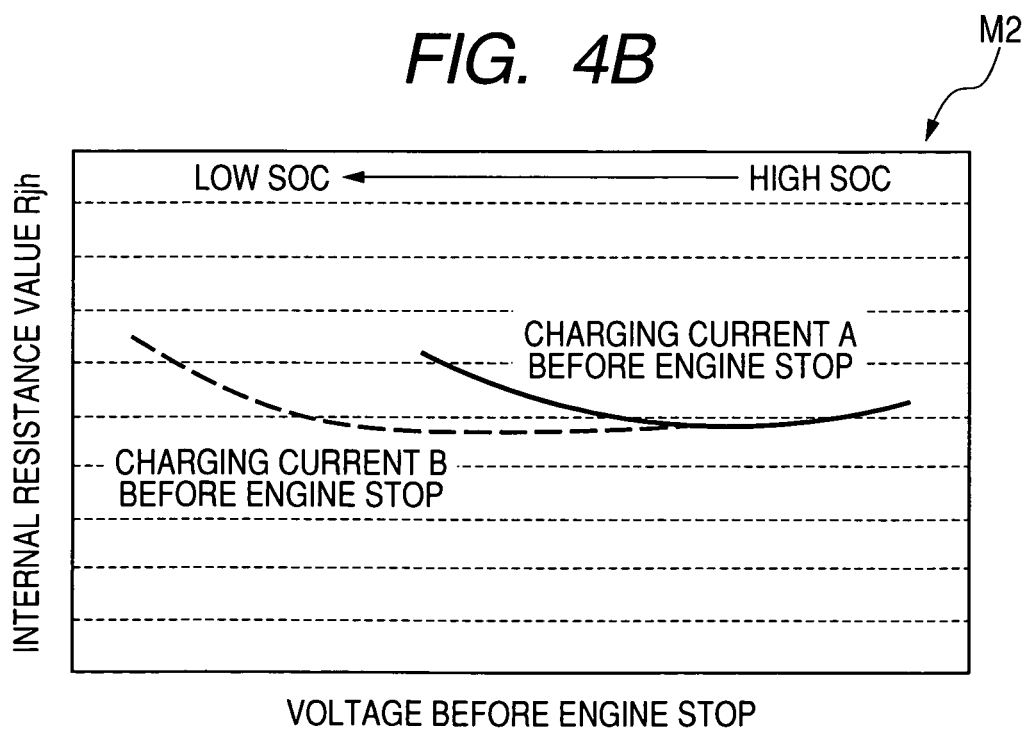
FIG. 4B is an estimation map M2 storing a relationship between an internal resistance value Rjh and a voltage of the on-vehicle battery before the stop operation of the internal combustion engine in a one to one correspondence.

FIG. 4B is an estimation map M2 storing a relationship between an internal resistance value Rjh and a voltage of the on-vehicle battery before the stop operation of the internal combustion engine in a one to one correspondence;

The internal resistance value Rjh estimation map M2 (the voltage-internal resistance value map) stores a plurality of curves (two curves in the embodiment shown in FIG. 4B) corresponding to the magnitude of the predetermined SOC in view that the characteristics of the charging current is changed according to the capacitance, SOC, and SOF of the battery 30 (hereinafter, referred to as the "SOC" for a group of capacitance, SOC, and SOF of the battery 30 for short).

Following, the ECU 50 calculates the current change amount ΔIjh of the on-vehicle battery 30 based on a difference between the currents output from the AC generator 22 of the electric power generation device 20 and the battery 30 (step S102). The ECU 50 easily estimates a product (expressed by the equation $\Delta Vjh = Rjh \cdot \Delta Ijh$) of the internal resistance value Rjh and the current change ΔIjh of the battery 30 (step S103).

As described above, it is possible to decrease an estimation error of the voltage drop amount ΔVjh caused by different types of vehicle as small as possible by estimating the internal resistance value Rjh based on the voltage or current detected immediately before the initiation of the stop operation of the internal combustion engine 10, and by adjusting the estimated voltage drop amount ΔVjh of the battery 30 according to the battery condition.

Next, the ECU 50 estimates the voltage drop amount ΔVbn (also referred to as the "post-stop operation voltage drop amount") during the period T2 from the completion of the stop operation until the initiation of the restart of the internal combustion engine 10 (step S200).

The internal resistance value and the current of the battery 30 are not approximately changed or approximately take the same values during the period T2 from the completion of the stop operation until the initiation of the restart operation of the internal combustion engine 10. The voltage drop amount ΔVbn of the on-vehicle battery 30 is approximately expressed by the width of the straight line in the vertical direction during the period T2 shown in FIG. 2.

The ECU 50 obtains the amount ΔVbn of voltage drop of the battery 30 during the period T2 using the voltage drop amount estimation map M3 (hereinafter also referred to as the "voltage drop estimation map after the engine stop"). The map M3 shows the relationship between the amount ΔVbn of voltage drop of the on-vehicle battery 30 and information of the battery condition (such as voltage, current, accumulated current value, temperature, and polarization state) in a one to one correspondence.

This voltage ΔVbn estimation map M3 is made in advance based on the information obtained when a predetermined capacitance of the battery 30 is discharged using a predetermined current value (as the maximum value to allow the idling stop control to be executed).

Figure 5:
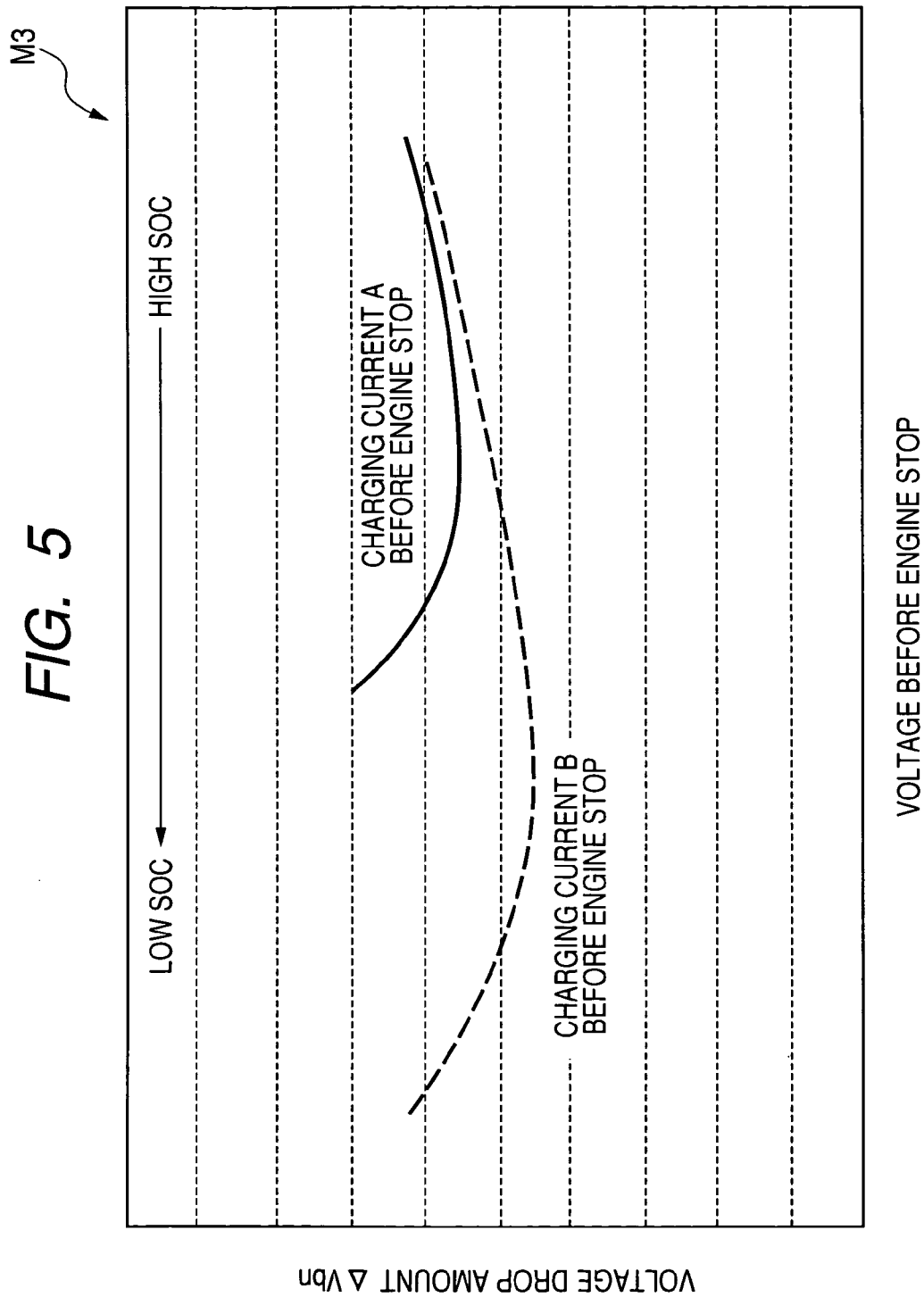
FIG. 5 is an estimation map M3 storing a relationship between a voltage drop amount ΔVbn and a voltage of the on-vehicle battery before the stop operation of the internal combustion engine in a one to one correspondence.
Figure 6:
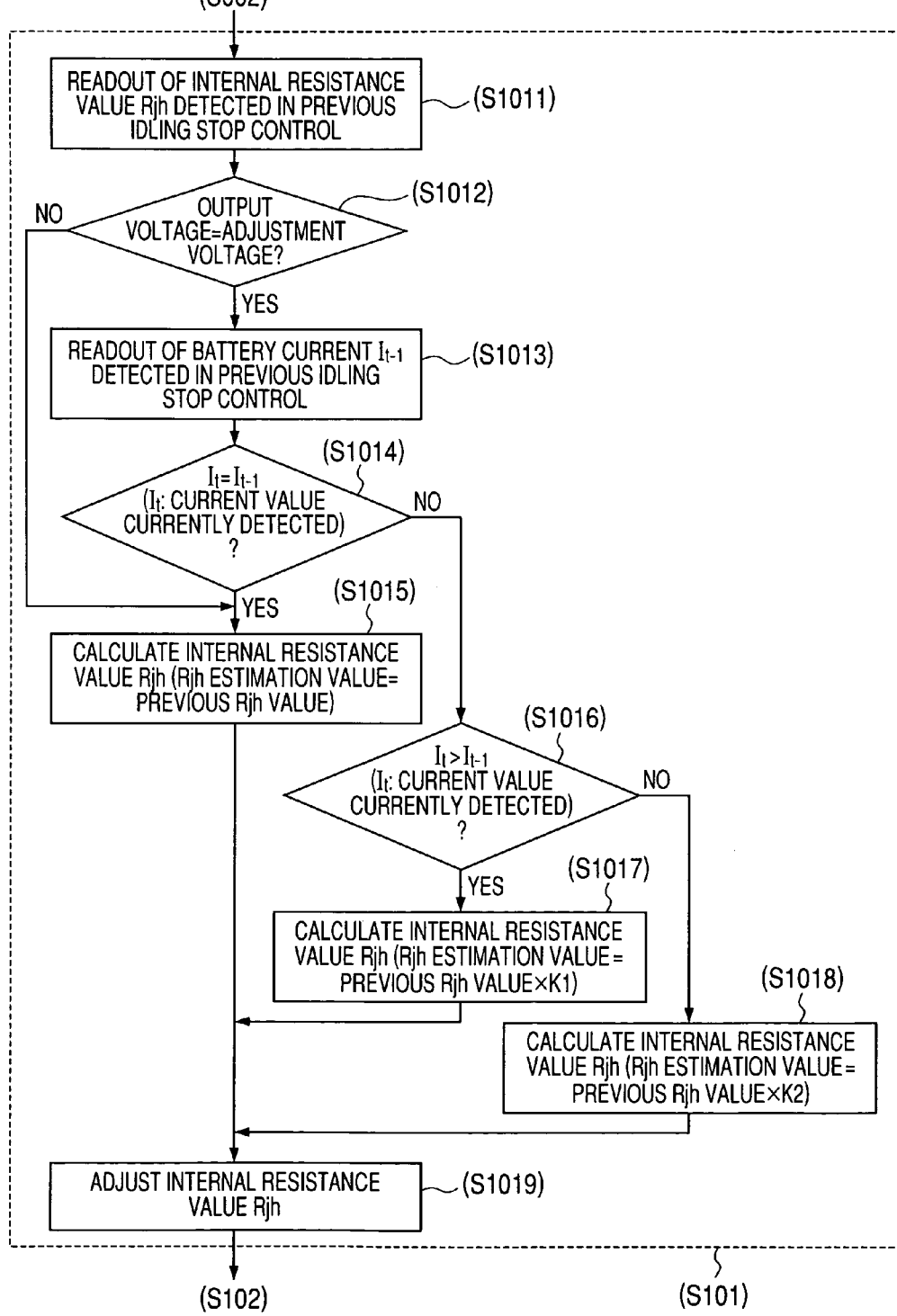
FIG. 6 is a flow chart showing a modification of the step to estimate the internal resistance value Rjh of the on-vehicle battery based on a previous internal resistance value detected in a previous idling stop control.

FIG. 5 is the estimation map M3 storing a relationship between a voltage drop amount ΔVbn and a voltage of the on-vehicle battery before the stop operation of the internal combustion engine 10 in a one to one correspondence. FIG. 6 is a flow chart showing a modification of the step to estimate the internal resistance value Rjh of the on-vehicle battery 30 based on a previous internal resistance value detected in a previous idling stop control.

For example, as shown in FIG. 6, the main data storage device 51 capable of regularly storing data in the ECU 50 of the embodiment stores in advance the voltage ΔVbn estimation map M3 indicating the relationship between the amount ΔVbn of voltage drop and the voltage before the initiation of the stop operation of the internal combustion engine 10 as the battery condition information.

The ECU 50 obtains the voltage drop amount ΔVbn of the on-vehicle battery 30 using the voltage ΔVbn estimation map M3 based on the voltage Vj0 of the battery 30 detected before the initiation of the stop operation of the internal combustion engine 10. The voltage ΔVbn estimation map M3 stores a plurality of curves (two curves in the embodiment, see FIG. 5), which correspond to the magnitude of the predetermined SOC, in view of the fact that the characteristics of the charging current is changed (charging currents A and B) according to the SOC such as the capacitance of the battery 30.

Next, the ECU 50 estimates the voltage drop amount ΔVst of the on-vehicle battery 30 during the period T3 from the initiation of the restart operation until the completion of the restart operation of the internal combustion engine 10 when the engine starter 40 starts (step S300).

The internal resistance value Rin of the on-vehicle battery 30 in the period T3 from the initiation of the restart operation until the completion of the restart operation of the internal combustion engine 10 is expressed by the slope of the straight line shown in FIG. 2. During the period T3, the maximum changed amount of current ΔImax is expressed by the width in the lateral axis of the straight line shown in FIG. 2. It is therefore possible to estimate the voltage drop amount ΔVst of the on-vehicle battery 30 during the period T3 based on those values Rin and ΔImax.

In the detection to stop the operation of the internal combustion engine 10 in the idling stop control, the ECU 50 often allows the internal combustion engine 10 to be executed only when the on-vehicle battery 30 has a high SOC value in order to prevent the deterioration of the on-vehicle battery 30 and to try to extend the lifetime of the on-vehicle battery 30. In this case, the less the SOC of the on-vehicle battery 30 is changed, the less the internal resistance value Rin and the maximum current change value ΔImax are also changed. In the embodiment of the present invention, the ECU 50 obtains the detected values of the maximum current change value ΔImax and the internal resistance value Rin based on the current value which is detected during the period T3 when the idling stop control is performed and then stored in the main data storage device 51 for regularly storing data. The ECU 50 then adjusts the detected maximum current change value ΔImax and the detected internal resistance value Rin according to the battery condition, in particular, the temperature change of the on-vehicle battery 30 (step S301, step S302).

The ECU 50 can simply estimate the voltage drop amount ΔVst during the period T3 based on the product (ΔVst=Rin·ΔImax) between the internal resistance value Rin and the maximum current change value ΔImax (step S303).

Next, the ECU 50 estimates the minimum voltage Vmin of the on-vehicle battery 30 when the internal combustion engine 10 restarts after the idling stop control is performed by subtracting the voltage drop amount ΔVbn during the period T2 estimated in step S100 and the voltage drop amount ΔVst during the period T3 estimated in step S200 from the voltage value Vj0 detected before the initiation of the stop operation of the internal combustion engine 10 (Vmin=Vj0−ΔVjh−ΔVbn−ΔVst).

Finally, the ECU 50 compares the minimum voltage Vmin and a reference voltage Vth (step S500).

When the comparison result indicates that the minimum voltage Vmin is more than the minimum voltage Vth ("Yes" in step S500), the ECU 50 determines to allow the internal combustion engine 10 to be stopped. In this case, when other conditions are satisfied, the ECU 50 performs the idling stop control.

On the other hand, when the comparison result indicates that the minimum voltage Vmin is not more than the minimum voltage Vth ("No" in step S500), the operation flows returns to step S001.

As described above in detail, the on-vehicle battery condition estimation device estimates the conditions of the battery 30 mounted to the vehicle in order to start the internal combustion engine 10. The on-vehicle battery condition estimation device is equipped with a pre-start voltage drop estimation means, a start voltage drop estimation means, and a minimum voltage estimation means.

The pre-start voltage drop estimation means corresponds to the steps S100 and S200 which estimate, as the voltage drop amount (ΔVjh+ΔVbn) before the start of the internal combustion engine 10, the battery voltage drop amount during the periods T1 and T2 based on at least one of the detected values regarding the conditions of the on-vehicle battery 30 (for example, a voltage detected value, a current detected value, a current change detected value, and an internal resistance value, and others), where the periods T1 and T2 are the period from the initiation of the stop operation of the internal combustion engine 10 until the initiation of the restart operation of the internal combustion engine 10. The start voltage drop estimation means corresponds to the operation in step S300 which estimates, as the voltage drop amount ΔVst, the voltage drop amount of the on-vehicle battery 30 during the period T3 from the initiation of the restart operation of the internal combustion engine 10 until the completion of the restart operation of the internal combustion engine 10 based on at least one of the detection values regarding the conditions of the on-vehicle battery 30.

The minimum voltage estimation means (corresponds to the operation in step S400) which estimates the minimum voltage of the on-vehicle battery 30 during the periods T1 to T3 from the initiation of the stop operation of the internal combustion engine 10 until the completion of the restart operation of the internal combustion engine 10 based on the voltage value Vj0 of the on-vehicle battery 30 detected before the initiation of the stop operation of the internal combustion engine 10, the start operation voltage drop amount (ΔVjh+ΔVbn) before the initiation of the restart operation of the internal combustion engine 10 estimated by the pre-start voltage drop estimation means (corresponds to the operation in steps S100 and S200), and the voltage drop amount ΔVst of the on-vehicle battery 30, when the internal combustion engine 10 restarts, estimated by the start operation voltage drop estimation means (corresponds to the operation in step S300).

Accordingly, it is possible to precisely estimate the minimum voltage value of the on-vehicle battery 30 when the internal combustion engine 10 starts and restarts by estimating the voltage drop amount (ΔVjh+ΔVbn) during the periods T1 and T2 after the initiation of the stop operation of the internal combustion engine 10 until the initiation of the restart operation of the internal combustion engine 10, and by estimating the voltage drop amount ΔVst of the on-vehicle battery 30 during the period T3 after the initiation of the restart operation of the internal combustion engine 10 until the completion of the restart operation of the internal combustion engine 10.

In addition, the pre-start voltage drop estimation means (corresponds to the operation in steps S100 and S200) has a pre-stop operation voltage drop estimation means (corresponding to the step S100) and a post-stop operation voltage drop estimation means (corresponding to the step S200). The pre-stop operation voltage drop estimation means estimates, as the pre-stop voltage drop amount ΔVjh, the voltage drop amount of the on-vehicle battery 30 during the period T1 from the initiation of the stop operation of the internal combustion engine 10 until the completion of the stop operation of the internal combustion engine 10 based on at least one of detection values regarding the conditions of the on-vehicle battery 30. The pre-start voltage drop estimation means (corresponds to the operation in steps S100 and S200) estimates, as the post-stop operation voltage drop amount ΔVbn, the voltage drop amount of the on-vehicle battery 30 during the period T2 from the completion of the stop operation of the internal combustion engine 10 until the initiation of the restart operation of the internal combustion engine 10 based on at least one of the detection values regarding the conditions of the on-vehicle battery 30.

The ECU 50 can thereby precisely estimate, as the pre-stop operation voltage drop amount ΔVjh and ΔVbn, the voltage drop amount of the on-vehicle battery 30 obtained by summing up the pre-stop operation voltage drop amount ΔVjh and the post-stop operation voltage drop amount ΔVbn.

Further, the on-vehicle battery condition estimation device according to the embodiment of the present invention is equipped with the current-internal resistance value map M1 shown in FIG. 4A and the voltage-internal resistance value map M2 shown in FIG. 4B. The maps M1 and M2 store the relationship between an internal resistance value and a current value in a one to one correspondence and the relationship between an internal resistance value and a voltage value in a one to one correspondence, respectively.

It is therefore possible for the pre-stop operation voltage drop estimation means (corresponding to the step S100) to simply estimate the pre-stop operation voltage drop amount ΔVjh based on the internal resistance value of the on-vehicle battery 30 obtained from the internal resistance value maps and the current change value of the on-vehicle battery 30 detected during the period T1 from the initiation of the stop operation of the internal combustion engine 10 until the completion of the stop operation of the internal combustion engine 10.

In particular, the internal resistance maps have the current-internal resistance value map M1 and the voltage-internal resistance value map M2 prepared in advance, where the map M1 stores the relationship between an internal resistance value Rjh and a current value in a one to one correspondence, and the map M2 stores the relationship between an internal resistance value Rjh and a voltage value in a one to one correspondence.

When the AC generator 22 outputs the output voltage as the adjustment voltage to the on-vehicle battery 30, the pre-stop operation voltage drop estimation means (corresponding to the step S100) can correctly and simply estimate the pre-stop operation voltage drop amount ΔVjh based on the current change amount ΔIjh of the on-vehicle battery 30 during the period T1 from the initiation of the stop operation until the completion of the stop operation of the internal combustion engine 10, the current detection value Ij0 of the on-vehicle battery 30 detected before the initiation of the stop operation of the internal combustion engine 10, and the internal resistance value Rjh with high accuracy obtained from the current-internal resistance value map M1.

On the other hand, when the AC generator 22 outputs the output voltage that is less than the adjustment voltage, the pre-stop operation voltage drop estimation means (corresponding to the step S100) can correctly and simply estimate the pre-stop operation voltage drop amount ΔVjh based on the current change amount ΔIjh of the on-vehicle battery 30 during the period T1 from the initiation of the stop operation until the completion of the stop operation of the internal combustion engine 10, the voltage detection value Vj0 of the on-vehicle battery 30 detected before the initiation of the stop operation of the internal combustion engine 10, and the internal resistance value Rjh with high accuracy obtained from the voltage-internal resistance value map M2.

That is, it is possible to obtain the internal resistance value Rjh with high accuracy from the maps M1 and M2 by properly using the maps M1 and M2 depending on the comparison result between the output voltage of the AC generator 22 and the adjustment voltage. It is thereby possible to precisely estimate the voltage drop amount ΔVjh of the on-vehicle battery 30 during the period T1 from the initiation of the stop operation of the internal combustion engine 10 until the completion of the stop operation of the internal combustion engine 10.

Still further, the on-vehicle battery condition estimation device has the post-stop operation voltage drop amount estimation map M3 which shows the relationship between an voltage of the on-vehicle battery 30 (as at least one of the battery condition information) before the stop operation of the internal combustion engine 10 and a voltage drop amount ΔVbn of the on-vehicle battery 30 under the stop operation of the internal combustion engine 10. It is therefore for the post-stop operation voltage drop estimation means (corresponding to the step S200) to precisely and simply estimate the post-stop operation voltage drop amount ΔVbn based on the post-stop operation voltage drop amount estimation map M3 and at least one of the battery condition information.

The battery condition information includes a current, a positive/negative sign of the accumulated current, temperature, and a polarization state of the on-vehicle battery 30.

It is sufficient that the post-stop operation voltage drop amount estimation map M3 stores the relationship between one of the above battery condition information and the voltage drop amount of the on-vehicle battery 30 in a one to one correspondence.

Still further, the start voltage drop estimation means (corresponds to the operation in step S300) obtains the detection values of the internal resistance value and the maximum current change value of the on-vehicle battery 30 detected during the period T3 from the initiation of the restart operation until the completion of the restart operation of the internal combustion engine 10 (see FIG. 2), and then precisely estimates the voltage drop amount ΔVst based on the internal resistance value, the maximum current change value of the on-vehicle battery 30.

Still further, the minimum voltage estimation means (corresponds to the operation in step S400) precisely and simply estimates the minimum voltage Vmin of the on-vehicle battery 30 during the periods T1 to T3 from the initiation of the stop operation of the internal combustion engine 10 until the completion of the restart operation of the internal combustion engine 10 by subtracting the pre-start operation voltage drop amount (ΔVjh+ΔVbn) and the voltage drop amount ΔVst of the on-vehicle battery 30 from the voltage value Vj0 detected before the initiation of the stop operation of the internal combustion engine 10.

The concept of the present invention is not limited by the embodiment describe above. For example, it is possible to make various modifications of the above embodiment within the scope of the present invention.

For example, the above embodiment estimates the internal resistance value Rjh of the on-vehicle battery 30 using the internal resistance value Rjh estimation map when the voltage drop amount ΔVjh (in step S100) is estimated during the period T1. The present invention is not limited by this. It is acceptable to estimate the internal resistance value Rjh of the on-vehicle battery 30 based on the internal resistance value Rjh and the current value $I_{t-1}$ which are detected during the period T1 in the previous idling stop control. FIG. 6 is the flow chart showing a detailed process of estimating the internal resistance value Rjh of the on-vehicle battery 30 as the modification of the embodiment.

In the modification shown in FIG. 6, the ECU 50 stores the internal resistance value Rjh detected during the period T1 in the previous idling stop control (step S1011). The ECU 50 then detects whether or not the output voltage of the AC generator 22 reaches the adjustment voltage (step S1012).

When the detection result indicates that the output voltage of the AC generator 22 is less than the adjustment voltage ("No" in step S1012), the operation flow progresses to step S1015. The operation in step S1015 will be explained later.

On the other hand, when detection result indicates that the output voltage of the AC generator 22 reaches the adjustment voltage ("Yes" in step S1012) (including an error component), the ECU 50 obtains the previous current value $I_{t-1}$ of the previous idling stop control (step S1013), and compares the previous current value $I_{t-1}$ with the current $I_t$ currently detected (step S1014).

When the comparison result indicates that the previous current value $I_{t-1}$ is equal to the currently-detected current value $I_t$ of the on-vehicle battery 30 ("Yes" in step S1014) (considering those current values to include error component), the ECU 50 sets the previous detection result as the internal resistance value Rjh from the previous detection (step S1015).

On the other hand, when the comparison result indicates that the previous current value $I_{t-1}$ is not equal to the currently-detected current value $I_t$ ("No" in step S1014), the ECU 50 detects a larger value (step S1016).

When the detection result in step S1016 indicates that the currently-detected current value $I_t$ is more than the previous current value $I_{t-1}$ ("Yes" in step S1016), the ECU 50 sets the value obtained by multiplying the previous current value $I_{t-1}$ and a coefficient K1 to the internal resistance value Rjh, where the coefficient K1 corresponds to the current difference $(It-It_{-1})$ between the previous current value $I_{t-1}$ and the currently-detected current value $I_t$ (step S1017).

On the other hand, when the detection result in step S1016 indicates that the currently-detected current value $I_t$ is not more than the previous current value $I_{t-1}$ ("No" in step S1016), the ECU 50 sets the value obtained by multiplying the previous current value $I_{t-1}$ and a coefficient K2 to the internal resistance value Rjh, where the coefficient K2 corresponds to the current difference $(It-It_{-1})$ between the previous current value $I_{t-1}$, and the currently-detected current value $I_t$ (step S1018).

The operation flow progresses to step S1019. The ECU 50 adjusts the internal resistance value Rjh according to the battery condition previously detected (step S1019). The ECU 50 then completes the above modification process shown in FIG. 6. The operation flow progresses to step S102 shown in FIG. 3.

According to the modification described above, the pre-stop operation voltage drop estimation means (corresponding to the step S100) obtains the current value and the internal resistance value of the on-vehicle battery 30 detected during the period T1 after the initiation of the previous stop operation of the internal combustion engine 10 to the completion of the stop operation. Further, the pre-stop operation voltage drop estimation means (corresponding to the step S100) sets the internal resistance value previously detected as the current internal resistance value when the output voltage of the AC generator 22 to charge the on-vehicle battery 30 is less than the adjustment voltage, or when the current value of the on-vehicle battery 30 currently detected is equal to the current value previously detected.

On the other hand, when the above output voltage of the AC generator 22 to charge the on-vehicle battery 30 is equal to the adjustment voltage, and when the current value of the on-vehicle battery 30 currently detected is not equal to the current value previously detected, the pre-stop operation voltage drop estimation means (corresponding to the step S100) sets the product value as the current internal resistance value, where the product value is obtained by multiplying the internal resistance value previously detected and the coefficient which corresponds to the ratio between the current value currently detected and the current value previously detected. It is thereby possible to simply and precisely estimate the pre-stop operation voltage drop amount ΔVjh based on the current change detection value and the current internal resistance value of the on-vehicle battery 30. It is thereby possible to eliminate a systematic error between the maps caused by different vehicle types, to obtain the internal resistance value of the on-vehicle battery 30 with high accuracy, and to precisely estimate the voltage drop amount of the on-vehicle battery 30 during the period T1 from the initiation of the stop operation until the completion of the stop operation of the internal combustion engine 10.

That is, when the previous idling stop control is performed, the ECU 50 obtains and stores into the memory device the current value and the internal resistance value of the on-vehicle battery 30 detected during the period from the initiation of the stop operation until the completion of the stop operation of the internal combustion engine 10. The ECU 50 sets the calculated value as the current internal resistance value, where this calculated value is obtained by multiplying the previous internal resistance value previously detected and the coefficient according to the comparison result between the current value currently detected and the previously detected current value of the on-vehicle battery 30. This can eliminate the reliability error caused by the vehicle type difference. It is thereby possible to more precisely estimate the voltage drop amount of the on-vehicle battery 30 during the period T1 from the initiation of the stop operation until the completion of the stop operation.

Still further, according to the on-vehicle battery condition estimation device of the embodiment of the present invention, although the estimation of the voltage drop amount ΔVbn during the period T2 is performed using the voltage drop amount ΔVbn estimation map (step S200), it is possible to estimate it using the detection value actually detected. In this case, the voltage drop amount ΔVbn detected during the period T2 when the previous idling stop control is stored per each of various battery condition (such as a charging capacitance ΔAh and a temperature) of the on-vehicle battery 30.

When a plurality of the detection values corresponding to the current battery condition is made, an approximation equation, which expresses a relationship between the estimation time to stop the internal combustion engine and the voltage drop amount ΔVbn, or an approximation equation is used, which expresses a relationship between the discharging capacitance ΔAh and the voltage drop amount ΔVbn, and the ECU 50 estimates the voltage drop amount ΔVbn of the on-vehicle battery 30 using those approximation equations. Because the on-vehicle battery condition estimation device according to the embodiment of the present invention stores the information such as the battery condition and accumulates them according to the elapse of time, and estimates the voltage drop amount ΔVbn of the on-vehicle battery 30 based on the recent battery condition. It is possible to decrease the estimation error caused by the decreasing of the battery capacitance and the deterioration of the on-vehicle battery 30.

Figure 7:
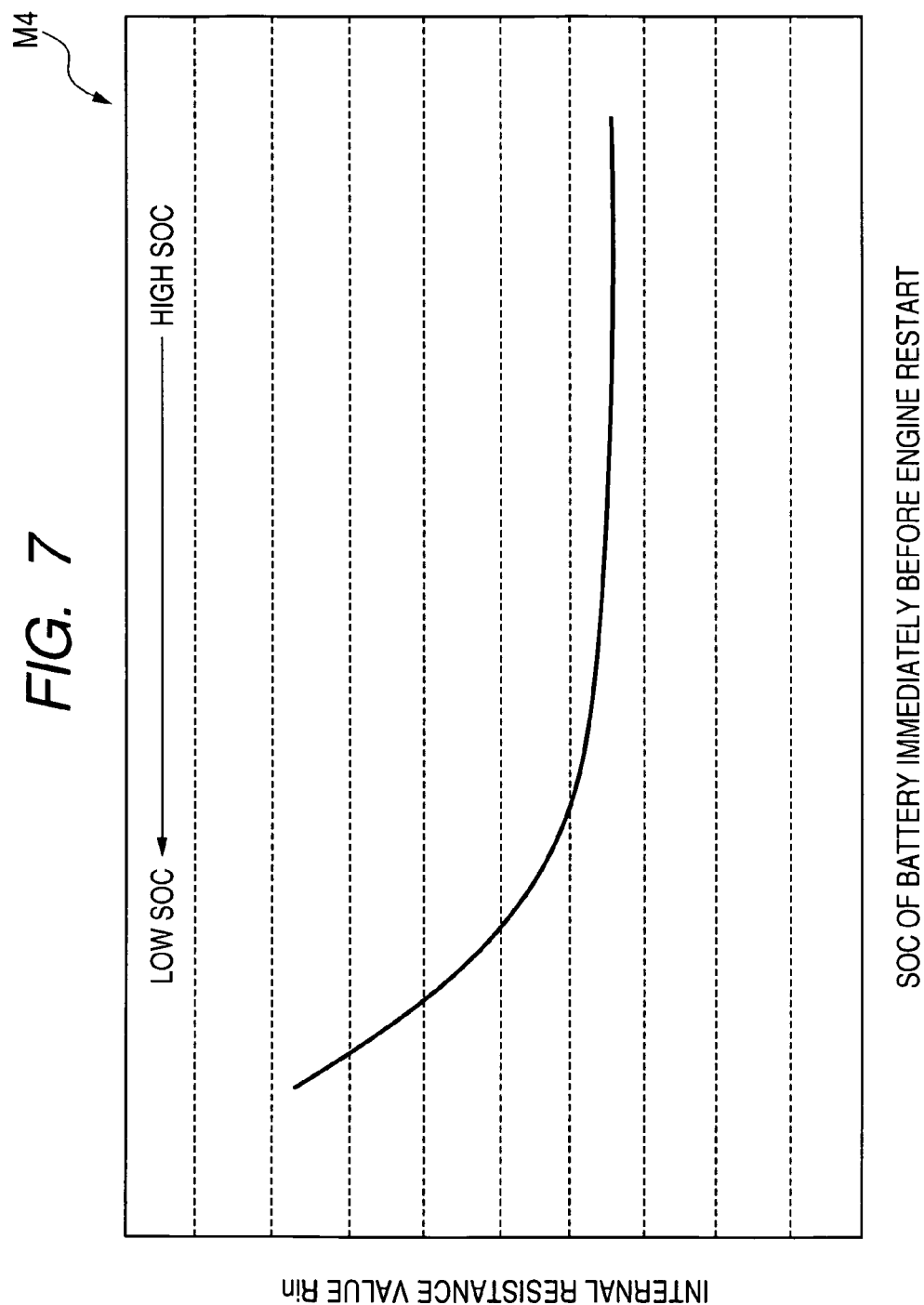
FIG. 7 is an estimation map M4 storing a relationship between an internal resistance value Rin and a state of charge (SOC) of the on-vehicle battery.

Further, according to the on-vehicle battery condition estimation device of the embodiment of the present invention previously described, the voltage drop amount ΔVbn of the on-vehicle battery 30 is estimated using the various detection values during the period T3 from the initiation of the restart operation until the completion of the restart operation of the internal combustion engine 10 (step S300). However, it is possible to estimate the voltage drop amount ΔVbn of the on-vehicle battery 30 based on the internal resistance value Rin estimation map M4 (or the capacitance-internal resistance value map) shown in FIG. 7. FIG. 7 shows the map storing the relationship between the SOC of the on-vehicle battery 30 and the internal resistance value Rin of the on-vehicle battery 30 in a one to one correspondence.

The ECU 50 can estimate the internal resistance value Rin of the on-vehicle battery 30 using the internal resistance value Rin estimation map M4, adjusts the internal resistance value Rin based on the maximum changed amount of current ΔImax during the period T3 previously described, and finally estimates the internal resistance value Rin of the on-vehicle battery 30 by the same manner previously described.

According to the on-vehicle battery condition estimation device of the embodiment of the present invention, the start voltage drop estimation means (corresponds to the operation in step S300) obtains the maximum changed amount of current based on the current value detected during the period T3 from the initiation of the restart operation to the completion of the restart operation of the internal combustion engine 10, and then simply obtains the internal resistance value Rin of the on-vehicle battery 30 with high accuracy based on the capacitance-internal resistance value map M4 of the on-vehicle battery 30. The ECU 50 can estimate the voltage drop amount ΔVst of the on-vehicle battery 30 when the internal combustion engine 10 starts based on the maximum changed amount of current and the internal resistance value of the on-vehicle battery 30.

Although the embodiment discloses the method to estimate the internal resistance value Rin of the on-vehicle battery 30 using the capacitance-internal resistance value Rin estimation map M4, it is also possible to directly estimate the voltage drop amount ΔVbn based on the SOC of the on-vehicle battery 30 using a voltage drop amount ΔVst estimation map (not shown) which shows a relationship between the SOC and the voltage drop amount ΔVst of the on-vehicle battery 30 in a one to one correspondence.

Still further, when the internal resistance value Rin or the voltage drop amount ΔVst of the on-vehicle battery 30 is estimated using the estimation map described above, it is possible to detect the current value corresponding to the internal resistance value Rin and the maximum changed amount of current ΔImax during the period T3 in the idling stop control, and to store the information of the battery condition during the above detection per SOC and the temperature of the on-vehicle battery 30. It is possible for a map update means to appropriately update the simulation map based on the stored information.

According to the on-vehicle battery condition estimation device of the embodiment of the present invention, it is possible to decrease the estimation error of the voltage drop amount ΔVst of the on-vehicle battery 30 caused by deterioration and a vehicle-type differential.

Still further, it is possible to decrease the estimation error of the voltage drop amount ΔVst of the on-vehicle battery 30 by appropriately adjusting the estimated voltage drop amount ΔVst using the information stored in the main data storage device 51 for regularly storing data such as a backup RAM and a EEPROM capable of regularly storing data regardless of electric power supply Still further, the on-vehicle battery condition estimation device of the embodiment of the present invention estimates the voltage drop amount ΔVjh before the stop operation of the internal combustion engine 10 and also estimates the voltage drop amount ΔVbn after the stop operation of the internal combustion engine 10. However, it is possible for the on-vehicle battery condition estimation device of the embodiment to estimate one of the voltage drop amount ΔVjh before the stop operation of the internal combustion engine 10 and the voltage drop amount ΔVbn after the stop operation of the internal combustion engine 10.

INDUSTRIAL APPLICABILITY

The on-vehicle battery condition estimation device of the embodiment of the present invention can be applicable to various cases to improve the detection function to permit the internal combustion engine 10 to be stopped under the idling stop control for a stopped vehicle.

(Other features and effects of the present invention)

In the battery condition estimation device as another aspect of the present invention, the pre-start operation voltage drop estimation means has a pre-stop operation voltage drop estimation means capable of estimating a battery voltage drop amount of the on-vehicle battery, as a pre-stop operation voltage drop amount, during a period from the initiation of the stop operation until the completion of the stop operation of the internal combustion engine based on at least one of the detection values regarding the battery condition.

According to the present invention, the pre-stop operation voltage drop estimation means in the pre-start operation voltage drop estimation means can estimate the battery voltage drop amount of the on-vehicle battery, as the pre-stop operation voltage drop amount, during the period from the initiation of the stop operation until the completion of the stop operation of the internal combustion engine based on at least one of the detection values regarding the battery condition. For example, the detection values regarding the battery condition are at least one of a voltage detection value of the on-vehicle battery, a current detection value of the on-vehicle battery, a current change amount detection value of the on-vehicle battery, an internal resistance value of the on-vehicle battery, and others.

In the battery condition estimation device as another aspect of the present invention, the pre-start operation voltage drop estimation means has a post-stop operation voltage drop estimation means capable of estimating a battery voltage drop amount of the on-vehicle battery, as a post-stop operation voltage drop amount, during a period from the completion of the stop operation until the initiation of the restart operation of the internal combustion engine based on at least one of the detection values regarding the battery condition.

According to the present invention, the post-stop operation voltage drop estimation means in the pre-start operation voltage drop estimation means can estimate the battery voltage drop amount of the on-vehicle battery, as the post-stop operation voltage drop amount, during the period from the completion of the stop operation until the initiation of the restart operation of the internal combustion engine based on at least one of the detection values regarding the battery condition. For example, the detection values regarding the battery condition are at least one of a voltage detection value of the on-vehicle battery, a current detection value of the on-vehicle battery, a current change amount detection value of the on-vehicle battery, an internal resistance value of the on-vehicle battery, and others.

In the battery condition estimation device as another aspect of the present invention, the pre-start operation voltage drop estimation means has a pre-stop operation voltage drop estimation means and a post-stop operation voltage drop estimation means. The pre-stop operation voltage drop estimation means estimates a battery voltage drop amount of the on-vehicle battery, as a pre-stop operation voltage drop amount, during a period from the initiation of the stop operation until the completion of the stop operation of the internal combustion engine based on at least one of the detection values regarding the battery condition. The post-stop operation voltage drop estimation means estimates a battery voltage drop amount of the on-vehicle battery, as a post-stop operation voltage drop amount, during a period from the completion of the stop operation until the initiation of the restart operation of the internal combustion engine based on at least one of the detection values regarding the battery condition.

According to the present invention, the pre-stop operation voltage drop estimation means in the pre-start operation voltage drop estimation means can estimate the battery voltage drop amount of the on-vehicle battery, as the pre-stop operation voltage drop amount, during the period from the initiation of the stop operation until the completion of the stop operation of the internal combustion engine based on at least one of the detection values regarding the battery condition. Further, the post-stop operation voltage drop estimation means in the pre-start operation voltage drop estimation means can estimate the battery voltage drop amount of the on-vehicle battery, as the post-stop operation voltage drop amount, during the period from the completion of the stop operation until the initiation of the restart operation of the internal combustion engine based on at least one of the detection values regarding the battery condition.

Accordingly, it is possible to precisely estimate the voltage drop amount of the on-vehicle battery, including the pre-stop operation voltage drop amount and the post-stop operation voltage drop amount, as the pre-start operation voltage drop amount of the on-vehicle battery. By the way, the detection values regarding the battery condition are at least one of a voltage detection value of the on-vehicle battery, a current detection value of the on-vehicle battery, a current change amount detection value of the on-vehicle battery, an internal resistance value of the on-vehicle battery, and others.

The battery condition estimation device as another aspect of the present invention further has an internal resistance value map which stores a relationship between a current value or a voltage value and an internal resistance value of the on-vehicle battery in a one to one correspondence. In particular, the pre-stop operation voltage drop estimation means estimates the pre-stop operation voltage drop amount based on the internal resistance value obtained from the internal resistance value map and a current change amount of the on-vehicle battery detected during the period from the initiation of the stop operation until the completion of the stop operation of the internal combustion engine.

According to the present invention, because the device is equipped in advance with the internal resistance value map that stores the relationship between the current value or the voltage value and internal resistance value of the on-vehicle battery in a one to one correspondence, the pre-stop operation voltage drop estimation means can simply and easily estimate the pre-stop operation voltage drop amount based on the internal resistance value with high accuracy obtained from the internal resistance value map and the current change amount of the on-vehicle battery detected during the period from the initiation of the stop operation until the completion of the stop operation of the internal combustion engine.

In accordance with another aspect of the present invention, the internal resistance value map in the battery condition estimation device has a current-internal resistance value map and a voltage-internal resistance value map. The current-internal resistance value map stores a relationship between a current value and an internal resistance value of the on-vehicle battery in a one to one correspondence. The voltage-internal resistance value map stores a relationship between a voltage value and an internal resistance value of the on-vehicle battery in a one to one correspondence. In particular, when the output voltage of the AC generator capable of charging the on-vehicle battery is equal to an adjustment voltage, the pre-stop operation voltage drop estimation means estimates the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the current-internal resistance value map based on the current value of the on-vehicle battery detected before the initiation of the stop operation of the internal combustion engine. Further, when the output voltage of the AC generator capable of charging the on-vehicle battery is less than the adjustment voltage, the pre-stop operation voltage drop estimation means estimates the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the voltage-internal resistance value map based on the voltage value of the on-vehicle battery detected before the initiation of the stop operation of the internal combustion engine.

According to the present invention, the internal resistance value map has in advance the current-internal resistance value map and the voltage-internal resistance value map. In particular, the current-internal resistance value map stores the relationship between the current value and the internal resistance value of the on-vehicle battery in a one to one correspondence. The voltage-internal resistance value map stores the relationship between the voltage value and the internal resistance value of the on-vehicle battery in a one to one correspondence. When the output voltage of the AC generator capable of charging the on-vehicle battery is equal to an adjustment voltage, the pre-stop operation voltage drop estimation means can precisely and simply estimate the pre-stop operation voltage drop amount of the on-vehicle battery based on the current change amount of the on-vehicle battery detected during the period from the initiation of the stop operation until the completion of the stop operation of the internal combustion engine and based on the internal resistance value of the on-vehicle battery obtained from the current-internal resistance value map based on the current value of the on-vehicle battery detected before the initiation of the stop operation of the internal combustion engine. Still further, when the output voltage of the AC generator capable of charging the on-vehicle battery is less than the adjustment voltage, the pre-stop operation voltage drop estimation means can precisely and simply estimate the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the voltage-internal resistance value map based on the voltage value of the on-vehicle battery detected before the initiation of the stop operation of the internal combustion engine.

Accordingly, the pre-stop operation voltage drop estimation means can select and use the optimum map in order to obtain the internal resistance value of the on-vehicle battery with high accuracy based on the difference between the output voltage of the AC generator and the adjustment voltage. Thereby, the pre-stop operation voltage drop estimation means can precisely estimate the voltage drop amount of the on-vehicle battery during the period from the initiation of the stop operation until the completion of the stop operation of the internal combustion engine.

In the battery condition estimation device as another aspect of the present invention, the pre-stop operation voltage drop estimation means obtains the current value and the internal resistance value which are detected during a period from the initiation of a previous stop operation until the completion of the previous stop operation of the internal combustion engine. The pre-stop operation voltage drop estimation means sets a value as a current internal resistance value of the on-vehicle battery, where the value is obtained by multiplying the internal resistance value previously detected and a coefficient corresponding to a ratio between the current value currently detected and the current value previously detected of the on-vehicle battery. The pre-stop operation voltage drop estimation means estimates the pre-stop operation voltage drop amount based on the current change amount of the on-vehicle battery and the internal resistance value currently detected.

According to the present invention, the pre-stop operation voltage drop estimation means can obtain the current value and the internal resistance value which are detected during from the initiation of the previous stop operation until the completion of the previous stop operation of the internal combustion engine. The pre-stop operation voltage drop estimation means can then set the value as the current internal resistance value of the on-vehicle battery. This value is obtained by multiplying the internal resistance value previously detected and the coefficient corresponding to the ratio between the current value currently detected and the current value previously detected of the on-vehicle battery. Therefore the pre-stop operation voltage drop estimation means can simply and precisely estimate the pre-stop operation voltage drop amount based on the current change amount of the on-vehicle battery and the internal resistance value currently detected.

That is, when the previous idling stop operation is performed, the current value and the internal resistance value of the on-vehicle battery detected during the period from the initiation of the stop operation to the completion of the stop operation are obtained. The above-detected internal resistance value of the on-vehicle battery is used as the internal resistance value according to the difference between the current value and the previous current value of the AC generator. Therefore it is possible to eliminate the difference in reliability of the maps between different vehicle types. It is thereby possible to precisely estimate the voltage drop amount of the on-vehicle battery.

The battery condition estimation device as another aspect of the present invention further has a post-stop operation voltage drop estimation map which stores a relationship between at least one of the information regarding the battery condition and a pre-stop operation voltage drop amount in a one to one correspondence. In particular, the post-stop operation voltage drop estimation means estimates the post-stop operation voltage drop amount of the on-vehicle battery based on at least one of the information regarding the battery condition and the post-stop operation voltage drop estimation map.

According to the present invention, the battery condition estimation device has the post-stop operation voltage drop estimation map which stores a relationship between at least one of the information regarding the battery condition and the pre-stop operation voltage drop amount in a one to one correspondence. It is possible for the post-stop operation voltage drop estimation means to simply and to precisely estimate the post-stop operation voltage drop amount of the on-vehicle battery based on at least one of the information regarding the battery condition and the post-stop operation voltage drop estimation map.

For example, at least one of the information regarding the battery condition indicates the relationship between the values and the voltage drop amount of the on-vehicle battery and stored in a memory such as a backup RAM and an EEPROM in the ECU, where the values indicate a voltage detection value, a current detection value, a sign (positive or negative) of an integration value of current, a temperature, and a polarization state of the on-vehicle battery.

In the battery condition estimation device as another aspect of the present invention, the start operation voltage drop estimation means obtains a maximum changed amount of current based on the current value and the internal resistance value which are detected during the period from the initiation of the restart operation until the completion of the restart operation of the internal combustion engine, and the start operation voltage drop estimation means estimates a start operation voltage drop amount of the on-vehicle battery based on the internal resistance value and the maximum changed amount of current of the on-vehicle battery.

According to the present invention, the start operation voltage drop estimation means obtains a maximum changed amount of current based on the current value and the internal resistance value which are detected during the period from the initiation of the restart operation until the completion of the restart operation of the internal combustion engine. Thereby, the start operation voltage drop estimation means can simply and precisely estimate the start operation voltage drop amount of the on-vehicle battery based on the internal resistance value and the maximum changed amount of current of the on-vehicle battery.

The battery condition estimation device as another aspect of the present invention further has a capacitance-internal resistance value map which stores a relationship between a capacitance of the on-vehicle battery and the internal resistance value of the on-vehicle battery in a one to one correspondence. In particular, the start operation voltage drop estimation means obtains the maximum changed amount of current based on the current value detected during the period from the initiation of a previous restart operation until the completion of the previous restart operation of the internal combustion engine. The start operation voltage drop estimation means obtains the internal resistance value of the on-vehicle battery based on the capacitance of the on-vehicle battery and the capacitance-internal resistance value map, and then estimates the start voltage drop amount of the on-vehicle battery based on the maximum changed amount of current and the internal resistance value of the on-vehicle battery.

According to the present invention, because the device has in advance the capacitance-internal resistance value map which stores the relationship between the capacitance of the on-vehicle battery and the internal resistance value of the on-vehicle battery in a one to one correspondence, the start operation voltage drop estimation means obtains the maximum changed amount of current based on the current value detected during the period from the initiation of the previous restart operation until the completion of the previous restart operation of the internal combustion engine. The start operation voltage drop estimation means further obtains the internal resistance value of the on-vehicle battery based on the capacitance of the on-vehicle battery and the capacitance-internal resistance value map. Therefore the start operation voltage drop estimation means can simply and precisely estimate the start voltage drop amount of the on-vehicle battery based on the maximum changed amount of current and the internal resistance value of the on-vehicle battery.

The battery condition estimation device as another aspect of the present invention further has a map update means capable of collecting information regarding the battery condition when the current value of the on-vehicle battery regarding the maximum changed amount of current is detected according to the capacitance and temperature of the on-vehicle battery and capable of updating the capacitance-internal resistance value map based on the information regarding the battery condition.

According to the present invention, the map update means collects the information regarding the battery condition when the current value of the on-vehicle battery regarding the maximum changed amount of current is detected according to the capacitance and temperature of the on-vehicle battery. The map update means updates the capacitance-internal resistance value map based on the information regarding the battery condition. Because the internal resistance value of the on-vehicle battery reflected by the detection information using the map is obtained, it is possible to decrease the estimation error of the voltage drop amount of the on-vehicle battery caused by the deterioration of the on-vehicle battery and the vehicle-type differential.

In the battery condition estimation device as another aspect of the present invention, the minimum voltage estimation means estimates the minimum voltage of the on-vehicle battery during the period from the initiation of the stop operation until the completion of the restart operation of the internal combustion engine by subtracting the pre-start operation voltage drop amount and the start operation voltage drop amount from the voltage value detected before the initiation of the stop operation of the internal combustion engine.

According to the present invention, the minimum voltage estimation means can simply calculate the minimum voltage of the on-vehicle battery during the period from the initiation of the stop operation until the completion of the restart operation of the internal combustion engine by subtracting the pre-start operation voltage drop amount and the start operation voltage drop amount from the voltage value detected before the initiation of the stop operation of the internal combustion engine, respectively.

According to the present invention, battery condition estimation device estimates in advance the voltage drop amount of the on-vehicle battery during the period from the initiation of the stop operation until the completion of the stop operation of the internal combustion engine before the initiation of the idling stop operation of the internal combustion engine when the vehicle stops, it is possible to estimate the minimum voltage of the on-vehicle battery. The battery condition estimation device judges the stop operation to be allowed based on the comparison result between the minimum voltage of the on-vehicle battery and the lower limit voltage as a reference voltage of the on-vehicle battery. This judgment prevents occurrence of difficulty in restarting the internal combustion engine by the voltage drop of the on-vehicle battery when the internal combustion engine is restarted. Still further, it is thereby possible to prevent deterioration of the on-vehicle battery by improper idling stop control without any loosing the vehicle occupant.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A battery condition estimation device capable of estimating conditions of an on-vehicle battery mounted to a vehicle during an operation period of an internal combustion engine counted from a restart operation of the internal combustion engine to a stop operation of the internal combustion engine, the on-vehicle battery being an electric power supply source to supply an electric power to on-vehicle devices such as an engine starter to start an internal combustion engine, comprising:
pre-start operation voltage drop estimation means capable of estimating a battery voltage drop amount, as a pre-start operation voltage drop amount of the on-vehicle battery, based on at least one of detection values regarding battery condition, during a period from initiation of the stop operation of the internal combustion engine until initiation of the restart operation of the internal combustion engine;
start operation voltage drop estimation means capable of estimating a battery voltage drop amount, as a start operation voltage drop amount, based on at least one of the detection values regarding the battery condition, during a period from the initiation of the restart operation until completion of the restart operation of the internal combustion engine; and
minimum voltage estimation means capable of estimating a minimum voltage of the on-vehicle battery during a period from the initiation of the stop operation of the internal combustion engine until the completion of the restart operation of the internal combustion engine based on a voltage value of the on-vehicle battery detected before the initiation of the stop operation of the internal combustion engine, the pre-start voltage drop amount of the on-vehicle battery estimated by the pre-start operation voltage drop estimation means, and the start operation voltage drop amount estimated by the start operation voltage drop estimation means,
wherein the pre-start operation voltage drop estimation means comprises pre-stop operation voltage drop estimation means capable of estimating a battery voltage drop amount of the on-vehicle battery, as a pre-stop operation voltage drop amount, during a period from the initiation of the stop operation until the completion of the stop operation of the internal combustion engine based on at least one of the detection values regarding the battery condition,
the battery condition estimation device further comprises an internal resistance value map which stores a relationship between a current value or a voltage value and an internal resistance value of the on-vehicle battery in a one to one correspondence,
wherein the pre-stop operation voltage drop estimation means estimates the pre-stop operation voltage drop amount based on the internal resistance value obtained from the internal resistance value map and a current change amount of the on-vehicle battery detected during the period from the initiation of the stop operation until the completion of the stop operation of the internal combustion engine, and
the internal resistance map has:
a current-internal resistance value map storing a relationship between a current value and an internal resistance value of the on-vehicle battery in a one to one correspondence; and
a voltage-internal resistance value map storing a relationship between a voltage value and an internal resistance value of the on-vehicle battery in a one to one correspondence,
wherein when the output voltage of an AC generator capable of charging the on-vehicle battery is equal to an adjustment voltage, the pre-stop operation voltage drop estimation means estimates the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the current-internal resistance value map based on the current value of the on-vehicle battery detected before the initiation of the stop operation of the internal combustion engine, and when the output voltage of the AC generator capable of charging the on-vehicle battery is less than the adjustment voltage, the pre-stop operation voltage drop estimation means estimates the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the voltage-internal resistance value map based on the voltage value of the on-vehicle battery detected before the initiation of the stop operation of the internal combustion engine.

2. A battery condition estimation device capable of estimating conditions of an on-vehicle battery mounted to a vehicle during an operation period of an internal combustion engine counted from a restart operation of the internal combustion engine to a stop operation of the internal combustion engine, the on-vehicle battery being an electric power supply source to supply an electric power to on-vehicle devices such as an engine starter to start an internal combustion engine, comprising:

pre-start operation voltage drop estimation means capable of estimating a battery voltage drop amount, as a pre-start operation voltage drop amount of the on-vehicle battery, based on at least one of detection values regarding battery condition, during a period from initiation of the stop operation of the internal combustion engine until initiation of the restart operation of the internal combustion engine;

start operation voltage drop estimation means capable of estimating a battery voltage drop amount, as a start operation voltage drop amount, based on at least one of the detection values regarding the battery condition, during a period from the initiation of the restart operation until completion of the restart operation of the internal combustion engine; and minimum voltage estimation means capable of estimating a minimum voltage of the on-vehicle battery during a period from the initiation of the stop operation of the internal combustion engine until the completion of the restart operation of the internal combustion engine based on a voltage value of the on-vehicle battery detected before the initiation of the stop operation of the internal combustion engine, the pre-start voltage drop amount of the on-vehicle battery estimated by the pre-start operation voltage drop estimation means, and the start operation voltage drop amount estimated by the start operation voltage drop estimation means, wherein the pre-start operation voltage drop estimation means comprises post-stop operation voltage drop estimation means capable of estimating a battery voltage drop amount of the on-vehicle battery, as a post-stop operation voltage drop amount, during a period from the completion of the stop operation until the initiation of the restart operation of the internal combustion engine based on at least one of the detection values regarding the battery condition, the battery condition estimation device further comprises an internal resistance value map which stores a relationship between a current value or a voltage value and an internal resistance value of the on-vehicle battery in a one to one correspondence, wherein the pre-stop operation voltage drop estimation means estimates the pre-stop operation voltage drop amount based on the internal resistance value obtained from the internal resistance value map and a current change amount of the on-vehicle battery detected during the period from the initiation of the stop operation until the completion of the stop operation of the internal combustion engine, and the internal resistance map has:
a current-internal resistance value map storing a relationship between a current value and an internal resistance value of the on-vehicle battery in a one to one correspondence; and
a voltage-internal resistance value map storing a relationship between a voltage value and an internal resistance value of the on-vehicle battery in a one to one correspondence, wherein when the output voltage of an AC generator capable of charging the on-vehicle battery is equal to an adjustment voltage, the pre-stop operation voltage drop estimation means estimates the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the current-internal resistance value map based on the current value of the on-vehicle battery detected before the initiation of the stop operation of the internal combustion engine, and when the output voltage of the AC generator capable of charging the on-vehicle battery is less than the adjustment voltage, the pre-stop operation voltage drop estimation means estimates the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the voltage-internal resistance value map based on the voltage value of the on-vehicle battery detected before the initiation of the stop operation of the internal combustion engine.

3. A battery condition estimation device capable of estimating conditions of an on-vehicle battery mounted to a vehicle during an operation period of an internal combustion engine counted from a restart operation of the internal combustion engine to a stop operation of the internal combustion engine, the on-vehicle battery being an electric power supply source to supply an electric power to on-vehicle devices such as an engine starter to start an internal combustion engine, comprising:

pre-start operation voltage drop estimation means capable of estimating a battery voltage drop amount, as a pre-start operation voltage drop amount of the on-vehicle battery, based on at least one of detection values regarding battery condition, during a period from initiation of the stop operation of the internal combustion engine until initiation of the restart operation of the internal combustion engine;

start operation voltage drop estimation means capable of estimating a battery voltage drop amount, as a start operation voltage drop amount, based on at least one of the detection values regarding the battery condition, during a period from the initiation of the restart operation until completion of the restart operation of the internal combustion engine; and minimum voltage estimation means capable of estimating a minimum voltage of the on-vehicle battery during a period from the initiation of the stop operation of the internal combustion engine until the completion of the restart operation of the internal combustion engine based on a voltage value of the on-vehicle battery detected before the initiation of the stop operation of the internal combustion engine, the pre-start voltage drop amount of the on-vehicle battery estimated by the pre-start operation voltage drop estimation means, and the start operation voltage drop amount estimated by the start operation voltage drop estimation means, wherein the pre-start operation voltage drop estimation means comprises:

pre-stop operation voltage drop estimation means capable of estimating a battery voltage drop amount of the on-vehicle battery, as a pre-stop operation voltage drop amount, during a period from the initiation of the stop operation until the completion of the stop operation of the internal combustion engine based on at least one of the detection values regarding the battery condition; and post-stop operation voltage drop estimation means capable of estimating a battery voltage drop amount of the on-vehicle battery, as a post-stop operation voltage drop amount, during a period from the completion of the stop operation until the initiation of the restart operation of the internal combustion engine based on at least one of the detection values regarding the battery condition, the battery condition estimation device further comprises an internal resistance value map which stores a relationship between a current value or a voltage value and an internal resistance value of the on-vehicle battery in a one to one correspondence, wherein the pre-stop operation voltage drop estimation means estimates the pre-stop operation voltage drop amount based on the internal resistance value obtained from the internal resistance value map and a current change amount of the on-vehicle battery detected during the period from the initiation of the stop operation until the completion of the stop operation of the internal combustion engine, and the internal resistance map has:
 a current-internal resistance value map storing a relationship between a current value and an internal resistance value of the on-vehicle battery in a one to one correspondence; and
 a voltage-internal resistance value map storing a relationship between a voltage value and an internal resistance value of the on-vehicle battery in a one to one correspondence, wherein when the output voltage of an AC generator capable of charging the on-vehicle battery is equal to an adjustment voltage, the pre-stop operation voltage drop estimation means estimates the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the current-internal resistance value map based on the current value of the on-vehicle battery detected before the initiation of the stop operation of the internal combustion engine, and when the output voltage of the AC generator capable of charging the on-vehicle battery is less than the adjustment voltage, the pre-stop operation voltage drop estimation means estimates the pre-stop operation voltage drop amount of the on-vehicle battery based on the current change amount of the on-vehicle battery detected during the period from the initiation of the stop operation until the completion of the stop operation of the internal combustion engine, and based on the internal resistance value of the on-vehicle battery obtained from the voltage-internal resistance value map based on the voltage value of the on-vehicle battery detected before the initiation of the stop operation of the internal combustion engine.

4. The battery condition estimation device according to claim 1, wherein the pre-stop operation voltage drop estimation means obtains the current value and the internal resistance value which are detected during after the initiation of a previous stop operation until the completion of the previous stop operation of the internal combustion engine, sets a value as a current internal resistance value of the on-vehicle battery, where the value is obtained by multiplying the internal resistance value previously detected and a coefficient corresponding to a ratio between the current value currently detected and the current value previously detected of the on-vehicle battery, and
 the pre-stop operation voltage drop estimation means estimates the pre-stop operation voltage drop amount based on the current change amount of the on-vehicle battery and the internal resistance value currently detected.

5. The battery condition estimation device according to claim 2, further comprising a post-stop operation voltage drop estimation map storing a relationship between at least one of the information regarding the battery condition and a pre-stop operation voltage drop amount in a one to one correspondence, and
 wherein the post-stop operation voltage drop estimation means estimates the post-stop operation voltage drop amount of the on-vehicle battery based on at least one of the information regarding the battery condition and the post-stop operation voltage drop estimation map.

6. The battery condition estimation device according to claim 1, wherein the start operation voltage drop estimation means obtains a maximum changed amount of current based on the current value and the internal resistance value which are detected during the period from the initiation of the restart operation until the completion of the restart operation of the internal combustion engine, and the start operation voltage drop estimation means estimates a start operation voltage drop amount of the on-vehicle battery based on the internal resistance value and the maximum changed amount of current of the on-vehicle battery.

7. The battery condition estimation device according to claim 1, further comprising a capacitance-internal resistance value map which stores a relationship between a capacitance of the on-vehicle battery and the internal resistance value of the on-vehicle battery in a one to one correspondence,
 wherein the start operation voltage drop estimation means obtains the maximum changed amount of current based on the current value detected during the period from the initiation of a previous restart operation until the completion of the previous restart operation of the internal combustion engine, obtains the internal resistance value of the on-vehicle battery based on the capacitance of the on-vehicle battery and the capacitance-internal resistance value map, and estimates the start operation voltage drop amount of the on-vehicle battery based on the maximum changed amount of current and the internal resistance value of the on-vehicle battery.

8. The battery condition estimation device according to claim 7, further comprising map update means capable of collecting information regarding the battery condition when the current value of the on-vehicle battery regarding the maximum changed amount of current is detected according to the capacitance and temperature of the on-vehicle battery and capable of updating the capacitance-internal resistance value map based on the information regarding the battery condition.

9. The battery condition estimation device according to claim 1, wherein the minimum voltage estimation means estimates the minimum voltage of the on-vehicle battery during the period from the initiation of the stop operation until the completion of the restart operation of the internal combustion engine by subtracting the pre-start operation voltage drop amount and the start operation voltage drop amount from the voltage value detected before the initiation of the stop operation of the internal combustion engine.

* * * * *